United States Patent [19]
Phillips

[11] 3,864,607
[45] Feb. 4, 1975

[54] STACKABLE HEAT SINK ASSEMBLY

[75] Inventor: Edward H. Phillips, Los Altos, Calif.

[73] Assignee: Programmed Power, Inc., Menlo Park, Calif.

[22] Filed: Mar. 16, 1972

[21] Appl. No.: 235,188

[52] U.S. Cl. ............................ 317/100, 317/234 W
[51] Int. Cl. ............................................ H02b 1/00
[58] Field of Search ........... 317/100, 234 A, 234 W; 174/15 R, 16 R; 165/80, 185 E

[56] References Cited

UNITED STATES PATENTS

| | | | |
|---|---|---|---|
| 1,718,663 | 6/1929 | Ogden | 317/234 A X |
| 2,328,488 | 8/1943 | Peters | 317/234 |
| 2,815,472 | 12/1957 | Jackson et al. | 317/100 X |
| 3,364,987 | 1/1968 | Bylund et al. | 174/16 R X |
| 3,523,215 | 8/1970 | Steinmetz et al. | 317/100 |
| 3,603,381 | 9/1971 | Scherbaum et al. | 317/234 A X |
| 3,652,903 | 3/1972 | Ericksson et al. | 174/15 R X |

*Primary Examiner*—Richard B. Wilkinson
*Assistant Examiner*—U. Weldon

[57] ABSTRACT

An improved heat sink assembly for dissipating the heat generated by a plurality of circuit components having high current ratings wherein the assembly includes a stack of heat conductive mounting plates and improved heat sink members arranged in a stack and held therein by a cage-like construction including a number of insulated tension rods secured to and spanning the distance between a pair of spaced base plates between which the stack of parts, including the circuit components, the mounting plates and the heat sink members, are disposed. One of the base plates has means thereon for applying pressure to the stack of parts. Each heat sink member is formed from an extrusion and an improved electrical connection is provided for at least one of the mounting plates.

8 Claims, 6 Drawing Figures

STACKABLE HEAT SINK ASSEMBLY

This invention relates to improvements in the dissipation of heat generated due to current flow in circuit components of the type having high power ratings and, more particularly, to an improved heat sink assembly formed by the stacking of a plurality of heat conductive parts in a stack with a number of such circuit components.

While the present invention can be suitable for a number of different heat sinking applications, it is especially for use with dissipating heat generated by a plurality of disk-pack SCR's having high current ratings and requiring the application of pressure to render them operable. The invention utilizes a number of stackable parts including heat conductive mounting plates, improved heat sink members and insulating plates, such parts being assembled in a stack with a pair of the mounting plates being on opposite sides of each SCR and at least one heat sink member being in thermal contact with one of the mounting plates of each pair. An insulating plate is used to electrically isolate a pair of adjacent SCR's. Means is provided at one end of the stack for applying a pressure to all of the SCR's and the various stackable parts of the assembly. One of the advantages of this construction is that a pressure source need not be provided for each SCR, respectively, as has been required in the past. Another advantage is that the thermal impedance between the parts is reduced to a minimum to assure maximum heat dissipation to the heat sink members.

Each heat sink member is comprised of an extrusion having a pair of opposed end plates interconnected by a plurality of divider plates which define air passages through the member. An initially long length of the extrusion can be formed by conventional extruding techniques, and the long extrusion can be cut into segments to form a number of heat sink members. In this way, the cost of the sink members is greatly reduced since it has been necessary in the past to dip braze heat sink members of conventional construction to render the parts thereof integral with each other so as to provide the proper heat conduction therethrough.

Since the present invention is comprised of stackable parts, it can be increased or decreased in size or capacity as needed by merely adding SCR's and parts to the stack or removing said elements from the stack. The pressure applying means will still be operable notwithstanding the size of the stack.

The mounting plates and heat sink members are generally of the same size and have flat faces of relatively large areas for making contact with the adjacent parts so that the thermal gradient between adjacent parts is kept relatively low to assure maximum heat flow across abutting faces.

Each mounting plate is provided with tapped holes in at least one side face thereof for securing an improved electrical connector thereto. The connector includes a bar having a notch which receives a pin operable to force a tab on an electrical conductor into substantially fused relationship to the side of the mounting plate when the bar is secured thereto by screws received within the tapped holes. In this way, the electrical resistance of the connection is reduced to a minimum to avoid the generation of heat due to current flow across the connection.

The stack of parts of the assembly are confined in an improved cage-like holder formed by a pair of spaced base plates interconnected by insulated tension rods. The rods serve as guides to position the parts as the stack is built up so as to eliminate the need for matching pins and holes on the parts as has been required in the past.

The primary object of this invention is to provide an improved heat sink assembly for a number of circuit components to dissipate the heat generated thereby wherein the assembly is comprised of stacked mounting plates and improved heat sink members in thermal contact with respective circuit components and a single mechanical pressure source for the entire stack so that the circuit components can simultaneously be subjected to the pressure, and the thermal impedance between adjacent parts can be reduced to a minimum.

Another object of this invention is to provide an improved heat sink assembly of the type described wherein the assembly is provided with an improved holder for its various parts and the assembly can be of any size to accommodate any number of circuit components and electrical connection can be made between adjacent circuit components by the judicious selection of mounting plates and heat sink members to thereby render the assembly extremely versatile yet capable of dissipating relatively large amounts of heat while the circuit components and the various mounting plates and heat sink members of the stack are subjected to a mechanical pressure from the single pressure source.

Another object of this invention is to provide heat sink assembly of the aforesaid character wherein the assembly is provided with an improved electrical connector for each mounting plate in electrical contact with an element of a circuit component with the connector being disposed to minimize the electrical resistance between it and the mounting plate to thereby minimize the generation of heat due to current flow through the connection.

Still another object of this invention is to provide an improved heat sink member for a heat sink assembly of the type described wherein the member is comprised of an extrusion having a pair of opposed, flat end plates which are interconnected by a plurality of longitudinally extending, parallel divider plates defining air passages through the member so that the latter can be formed by cutting an elongated length of the extrusion to a desired size to thereby minimize production costs of the heat sink member itself.

Other objects of this invention will become apparent as the following specification progresses, reference being had to the accompanying drawings for an illustration of the invention.

Figure 1:
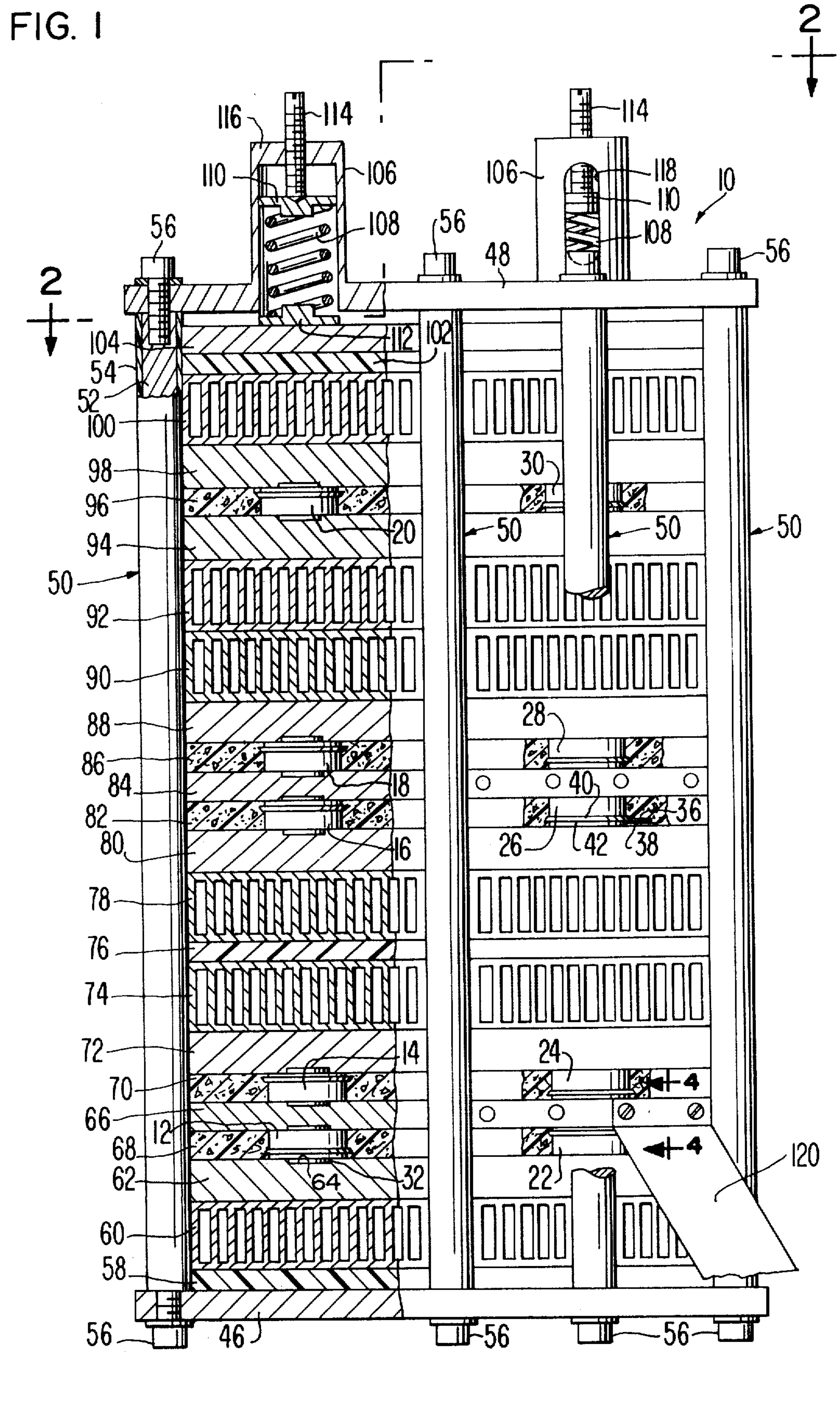
FIG. 1 is a side elevation view, partly broken away and in section, of the heat sink assembly of the present invention.
Figure 3:
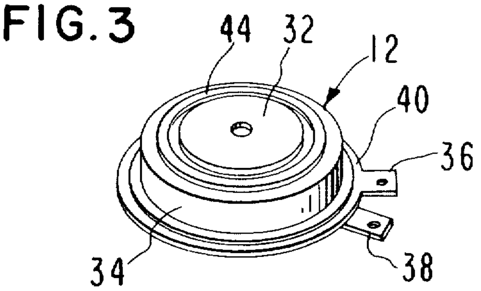
FIG. 3 is an enlarged, perspective view of the circuit component suitable for use with the assembly.

The heat sink assembly of the present invention is shown in FIG. 1 and is denoted by the numeral 10. Assembly 10 is provided with two, side-by-side stacks of parts, each stack including a plurality of circuit components, such as SCR's of the disk pack type, a number of heat conductive mounting plates, and a group of heat conductive heat sink members. One stack contains circuit components 12, 14, 16, 18 and 20 and the other stack contains circuit components 22, 24, 26, 28 and 30. Each of the SCR's is of the type shown in FIG. 3 wherein a pair of opposed, circular, metallic locating pads 32 (only one of which is shown in FIG. 3) are mounted at respective ends of a cylindrical, ceramic body 34 within which the cathode and anode are mounted. Gate terminals 36 and 38 project laterally from annular mounting rings 40 and 42 (FIG. 1) and make electrical connection with gate elements within body 34. Locating pads 32 project axially, outwardly from adjacent annular, metallic locating rings 44. Electrical connection between the operating elements of such a component is made by applying inwardly directed mechanical pressure to locating pads 32 and maintaining such pressure during circuit operation.

Figure 2:
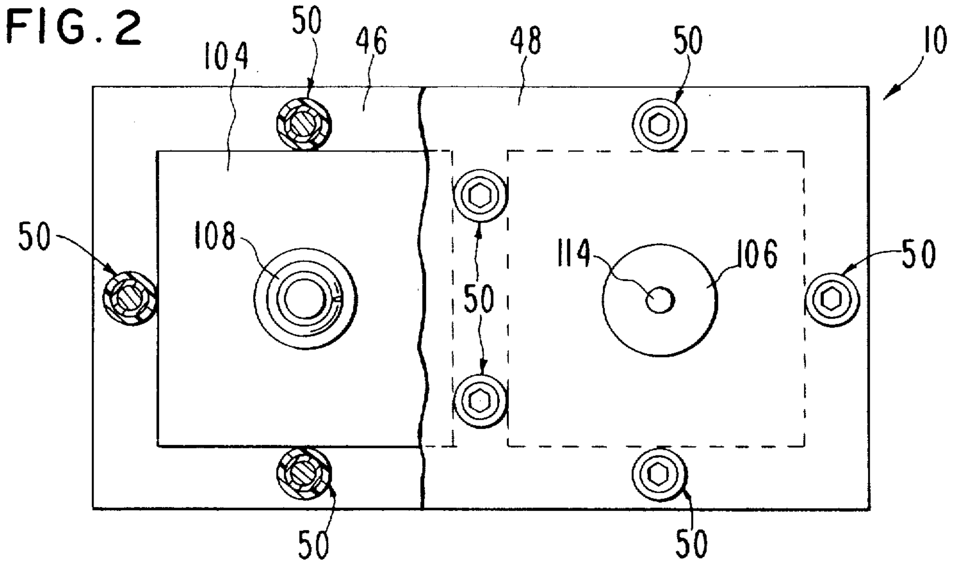
FIG. 2 is a cross-sectional view taken along line 2—2 of FIG. 1.

Assembly 10 includes a parts holder comprising a lower base plate 46, an upper base plate 48 and a plurality of insulated tension rods 50 which interconnect plates 46 and 48 and form a cage-like construction for the holder. Each rod has a central, metallic core 52 and an outer tube 54 of electrically insulating material surrounding core 52. Machine screws 56, passing through base plates 46 and 48, are threaded into the proximal ends of respective cores 52 to connect plates 46 and 48 to the rods. For purposes of illustration, base plates 46 and 48 are rectangular as shown in FIG. 2 and are interconnected by a group of eight tension rods 50, two on each side, one at each end, and two in the middle between the adjacent stacks of circuit components.

Each of the two stacks of circuit components are identical in construction in that they have the same parts and part locations; however, the two stacks could differ in construction, if desired. Also, the various parts of each stack, except for the circuit components, are all square and have flat outer surfaces although they may differ in thickness.

Each stack includes a lower electrically insulating plate 58 disposed on lower base plate 46, a metallic, heat conducting heat sink member 60 disposed on the upper surface of plate 58 and a metallic mounting plate placed on the upper surface of heat sink member 60. The upper surface of metallic mounting plate 62 has an annular recess defining a circular spot face 64 which receives and locates the adjacent locating pad 32 of component 12 so that the component cannot shift laterally on the upper surface of mounting plate 62. Another metallic mounting plate 66 is disposed between components 12 and 14 and mounting plate 66, as all further mounting plates to be mentioned, can also have spot faces on its outer surfaces for positioning the locating pads of adjacent circuit components. Also, mounting plate 66 places components 12 and 14 in electrical contact with each other.

Annular air dams 68 and 70 surround components 12 and 14 to prevent airflow past the same. Each air dam can be of any suitable material, such as plastic foam or the like, and is constructed to allow electrical connections to be made to gate terminals 36 and 38 of each circuit component (FIG. 1).

A metallic mounting plate 72 is mounted above and in contact with component 14, and a heat sink member 74 is disposed above and in engagement with mounting plate 72. To isolate components 12 and 14 from components 16, 18 and 20, an electrically insulating plate 76 is disposed between heat sink member 74 and a metallic heat sink member 78. A metallic mounting plate 80 is disposed above and in engagement with heat sink member 78 and is in contact with circuit component 16, the latter being surrounded by an annular air dam 82. Component 16 is electrically coupled to component 18 by a metallic mounting plate 84 disposed between components 16 and 18, there being an air dam 86 surrounding component 18.

A metallic mounting plate 88 is disposed between component 18 and a pair of abutting heat sink members 90 and 92, member 92 being in engagement with a metallic mounting plate 94 thereabove which is in contact with circuit component 20, the latter being surrounded by an annular air dam 96. A metallic mounting plate 98 is disposed between component 20 and a metallic heat sink member 100 disposed below an electrically insulating plate 102 on which rests a pressure plate 104 of a suitable material. All of the foregoing parts of the left-hand stack of FIG. 1 are essentially duplicated in the right-hand stack; thus, it is not considered necessary to describe the make-up of this stack nor to place the corresponding numerals thereon.

All of the foregoing parts of the stack can be built up in building-block fashion, beginning at lower base plate 46 and placing the various mounting plates, insulating plates, and heat sink members as well as the components in the spaces between the tension rods when upper base plate 48 is removed. The tension rods thus serve as guides for aligning the various parts. The thermal impedance at the junctions between the locating pads of the various circuit components and the adjacent mounting plates is kept relatively low by the use of a suitable high-conductive material, such as silicon grease or the like. Moreover, the thermal gradiant across the junctions between the various mounting plates and the adjacent heat sink members is relatively low due to the relatively large surface areas in conduct with each other.

Upper base plate 48 is provided with a pair of cylindrical, hollow housings 106 which are centrally located with respect to the stacks therebelow. Each housing 106 has a coil compression spring 108 therewithin and a pair of upper and lower pressure transmitting disks 110 and 112 as well as an adjustment screw 114 threaded into the upper, closed end 116 of housing 106. Each housing is further provided with a vertical slot 118 in the side thereof so that the amount of compression of the corresponding spring 108 can be observed.

Figure 4A:
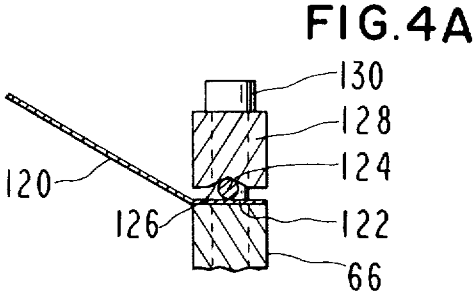
FIG. 4A is an enlarged, cross-sectional view looking in the direction of line 4—4 of FIG. 1 and showing an improved electrical connector in a semi-operative position.
Figure 4B:
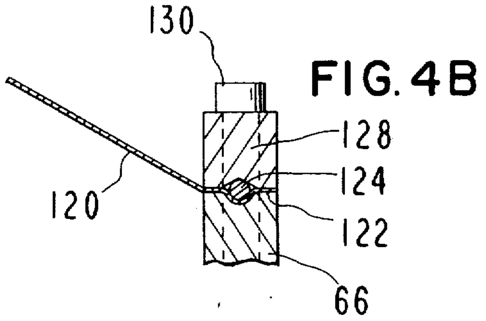
FIG. 4B is a view similar to FIG. 4A but showing the connector fully operative.

Each of the various mounting plates making electrical connection to adjacent circuit components is provided with a number of internally threaded screw holes on at least one side face at the outer periphery thereof. For purposes of illustration, each mounting plate has four tapped screw holes in one side face as shown in the right-hand stack in FIG. 1. These screw holes are used to couple a conductor 120 to the corresponding mounting plate in the manner shown in FIGS. 1, 4A and 4B. For purposes of illustration, conductor 120 is comprised of a metallic ribbon or foil having a yieldable, end tab 122 (FIGS. 4A and 4B) which is provided with holes alignable with a pair of holes in an adjacent mounting plate. A metallic pin 124 carried within a notch 126 in one face of a pressure bar 128 whose length is substantially equal to that of tab 122 engages tab 122 and forces the tab into substantially fused relationship with the side of the mounting plate when a pair of screws 130 force bar 128 toward the mounting plate. As shown in FIG. 4B, this causes the tab to yield and to be effectively cold-welded to the mounting plate so as to provide a positive electrical connection thereto and to minimize the electrical resistance of such a junction. While FIG. 4B slightly exaggerates the physical deformation of tab 122 and the adjacent mounting plate, it is utilized to illustrate the fusing action by means of which tab 122 becomes essentially a part of the mounting plate.

In use, the various parts of assembly 10 are stacked, one on top of each other, beginning with lower base plate 46. Since the various plates and heat sink members are of the same plan form, they can be easily stacked and vertically aligned with each other by virtue of the guiding action of rods 50. The stacking occurs after the rods have been secured to base plate 46 and arranged so that they extend upwardly therefrom. As soon as the stacking has been completed, base plate 48 is coupled to the upper ends of the tension rods and screws 114 are manipulated so that a predetermined mechanical pressure is applied to the upper pressure plates 104 by spring 108. This pressure is transmitted through the various stacks and, by virtue of the pressure, the various circuit components are enabled and the thermal impedance of the junctions between the various parts is effectively minimized. A force of 800 to 1,000 pounds is typically utilized with assembly 10. The force can be determined by observing, with the use of a suitable instrument, the amount of compression of springs 108 by viewing the same through slots 118.

When the components are in use, the heat generated by the current flow therethrough is dissipated by heat flow from the SCR pads through the adjacent mounting plates and then to the heat sink members in thermal contact with the mounting plates. Air flowing through the heat sink members carries off the heat radiating therefrom.

Additional cooling may be obtained by including additional heat sink members in each stack as is shown by the placement of heat sink members 90 and 92 (FIG. 1) in thermal contact with each other. Also, less cooling may be obtained, for instance, for low-current applications by omitting a heat sink member on one side of a circuit component. All electrical isolation may be obtained by including insulating plates of the type similar to plates 58, 76 and 102. These plates can be of a suitable insulating material, such as phenolic resin or the like.

Figure 5:
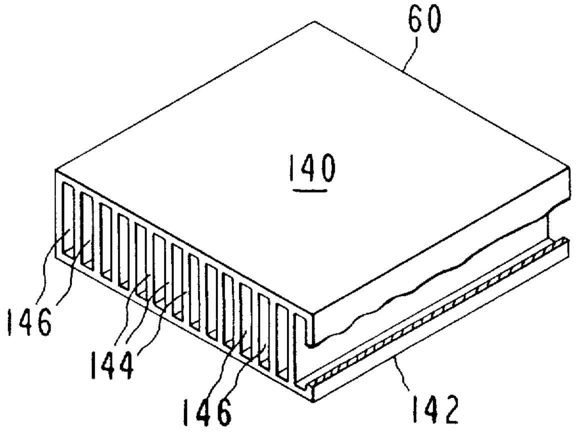
FIG. 5 is a perspective view of the heat sink member of this invention.

Each heat sink member, shown in FIG. 5, is comprised preferably of an extrusion which includes a pair of parallel end plates 140 and 142 which are interconnected by a plurality of parallel divider plates 144 which divide the space between plates 140 and 142 into a plurality of air passages denoted by the numeral 146. Each heat sink member is formed from an initially long length of an extrusion which is cut into segments defining a plurality of heat sink members. For instance, for purposes of illustration, the extrusion is 4 inches wide and can be cut into 4-inch lengths so that the heat sink member is square and will conform to the size of the mounting plates. It is formed from a suitable material having a high thermal conductivity and it is ready for use immediately upon being cut from the long extrusion.

In the claims:

1. A heat sink assembly for a plurality of circuit components of the type enabled by the application of mechanical pressure thereto comprising: a number of heat conducting mounting plates, there being a pair of mounting plates for each circuit component, respectively, each mounting plate having a pair of opposed, flat faces, each pair of mounting plates being disposed with respective faces in thermal contact with respective sides of the corresponding circuit component; a heat sink member for at least one of each pair of mounting plates, said heat sink member having a plurality of open-end air passages therethrough and a working surface in thermal contact with the adjacent face of the corresponding mounting plate, the working surface and the adjacent face having an area greater than the area of the adjacent side of the corresponding component to minimize the thermal impedance between the surface and the face; cage means defining a holder for confining a stack of said circuit components, said mounting plates and said heat sink members, the mounting plates and heat sink members being stackable one-by-one in the holder; and means coupled with the holder for applying a predetermined mechanical pressure simultaneously to the stack of parts held thereby.

2. A heat sink assembly as set forth in claim 1, wherein said holder includes a pair of spaced base plates and a number of spaced tension rods interconnecting said base plates, the rods being at the outer periphery of and confining a space for receiving said stack of parts, said pressure applying means being carried by one of said base plates.

3. A heat sink assembly as set forth in claim 1, wherein is included an insulating plate between a mounting plate of one circuit component and a mounting plate of an adjacent circuit component to electrically isolate said circuit components.

4. A heat sink assembly comprising: a plurality of stacked circuit components capable of being rendered operable by the application of mechanical pressure thereto; a pair of spaced base plates; a plurality of tension rods interconnecting the base plates and defining the outer periphery of a confined space for receiving a stack of parts; a number of heat conductive mounting plates, each mounting plate having opposed, flat, first and second faces, there being a pair of mounting plates for each circuit component, respectively, with the first faces of each pair of mounting plates being disposed for thermal contact with respective sides of the corresponding circuit component, each first face having an area greater than that of the side in thermal contact therewith; a heat sink member for each circuit component, respectively, each heat sink member having a pair of opposed, flat surfaces, one of the surfaces being in thermal contact with and of substantially the same area as the second face of the adjacent mounting plate, each heat sink member being comprised of an extrusion having a plurality of open-end air passages therethrough, said mounting plates and said heat sink members being stackable one-by-one in said space to form with said circuit components a stack of parts; and means on one of the base plates for applying a predetermined mechanical pressure simultaneously to the stack of parts in said space.

5. A heat sink assembly as set forth in claim 4, wherein said pressure-applying means includes a housing having a compression spring therein, a pressure plate engageable with said stack of parts, and means coupled with the housing for compressing the spring through a predetermined distance.

6. A heat sink assembly as set forth in claim 4, wherein each circuit component has a locating pad at each end thereof, respectively, one of the mounting plates having a recess therein defining a spot face for positioning a locating pad of the adjacent circuit component.

7. A heat sink assembly as set forth in claim 4, wherein is provided an electrically insulating plate between one mounting plate of one circuit component and a mounting plate of the adjacent circuit component.

8. A heat sink assembly as set forth in claim 7, wherein is included a connector for an electrical conductor having a tab at one end thereof, said conductor including a bar having a transversely V-shaped notch therein, a metallic pin receivable within the notch and engageable with said tab, and fastener means coupled with the bar for rigidly securing the same to one side of the mounting plate to force the pin against the tab of the conductor to thereby urge the tab into fused relationship to the side of the mounting plate.

* * * * *